US010243661B2

(12) United States Patent
Sorin et al.

(10) Patent No.: US 10,243,661 B2
(45) Date of Patent: Mar. 26, 2019

(54) OPTICAL MODE MATCHING (71) Applicant: HEWLETT PACKARD ENTERPRISE DEVELOPMENT LP, Houston, TX (US)

(72) Inventors: Wayne Sorin, Mountain View, CA (US); Michael Renne Ty Tan, Menlo Park, CA (US); Sagi V Mathai, Sunnyvale, CA (US); Georgios Panotopoulos, Berkeley, CA (US); Paul K Rosenberg, Sunnyvale, CA (US)

(73) Assignee: Hewlett Packard Enterprise Development LP, Housto, TX (US)

( * ) Notice: Subject to any disclaimer, the term of this patent is extended or adjusted under 35 U.S.C. 154(b) by 0 days.

(21) Appl. No.: 15/502,349

(22) PCT Filed: Aug. 15, 2014

(86) PCT No.: PCT/US2014/051249
§ 371 (c)(1),
(2) Date: Feb. 7, 2017

(87) PCT Pub. No.: WO2016/024991
PCT Pub. Date: Feb. 18, 2016

(65) Prior Publication Data
US 2017/0230116 A1  Aug. 10, 2017

(51) Int. Cl.
G02B 6/12 (2006.01)
H04B 10/50 (2013.01)
(Continued)

(52) U.S. Cl.
CPC ....... H04B 10/503 (2013.01); G02B 6/29367 (2013.01); G02B 6/4204 (2013.01);
(Continued)

(58) Field of Classification Search
CPC .............. G02B 6/29367; G02B 6/4204; G02B 6/4214; G02B 6/4231; H01S 5/0071;
(Continued)

(56) References Cited

U.S. PATENT DOCUMENTS 6,198,864 B1 * 3/2001 Lemoff .............. G02B 6/29367
                                                     385/24
6,563,976 B1 * 5/2003 Grann ................ G02B 6/29311
                                                     385/24
(Continued)

OTHER PUBLICATIONS

Lemoff et al., "500-Gbps Parallel-WDM Optical Interconnect", 2005 Electronic Components and Technology Conference, 2005, pp. 1027-1031.
(Continued)

Primary Examiner — Ryan A Lepisto
Assistant Examiner — Guy G Anderson
(74) Attorney, Agent, or Firm — Sheppard Mullin Richter & Hampton LLP (57) ABSTRACT An apparatus includes a first and second VCSEL, each with an integrated lens. The VCSELs emit a first light beam having first optical modes at first wavelengths and a second light beam having second optical modes at second wavelengths. The apparatus also has an optical block with a first and second surface, a mirror coupled to the second surface, and a wavelength-selective filter coupled to the first surface. The first integrated lens mode matches the first beam to the optical block, and the second integrated lens mode matches the second beam to the optical block such that the first beam and second beam each have substantially a beam waist with a beam waist dimension at the first and second input region, respectively. An exit beam that includes light from the first beam and the second beam is output from the second surface of the optical block.

7 Claims, 7 Drawing Sheets (51) Int. Cl.
*G02B 6/42* (2006.01)
*G02B 6/293* (2006.01)
*H01S 5/40* (2006.01)
*H01S 5/42* (2006.01)
*H01S 5/00* (2006.01)
*H01S 5/026* (2006.01)
*H01S 5/183* (2006.01)
*H01S 5/022* (2006.01)
*H04Q 11/00* (2006.01)

(52) U.S. Cl.
CPC ......... *G02B 6/4214* (2013.01); *G02B 6/4231* (2013.01); *H01S 5/0071* (2013.01); *H01S 5/026* (2013.01); *H01S 5/18305* (2013.01); *H01S 5/4012* (2013.01); *H01S 5/4087* (2013.01); *H01S 5/423* (2013.01); *H01S 5/005* (2013.01); *H01S 5/02284* (2013.01); *H04Q 2011/0009* (2013.01)

(58) Field of Classification Search
CPC .... H01S 5/026; H01S 5/18305; H01S 5/4012; H01S 5/4087; H01S 5/423; H04B 10/503; H04Q 2011/0009
USPC .................................. 385/14, 28–29, 31–32
See application file for complete search history.

(56) References Cited

U.S. PATENT DOCUMENTS

| | | | |
|---|---|---|---|
| 6,636,658 B2 | 10/2003 | Goodman et al. | |
| 6,751,379 B2 | 6/2004 | Capewell et al. | |
| 6,787,868 B1* | 9/2004 | McGreer | G02B 6/12004 257/425 |
| 6,945,711 B2* | 9/2005 | Chen | G02B 6/2938 385/93 |
| 7,184,621 B1 | 2/2007 | Zhu | |
| 7,260,328 B2* | 8/2007 | Kropp | G02B 6/29367 385/47 |
| 7,327,772 B2 | 2/2008 | Kuznetsov | |
| 7,349,602 B2* | 3/2008 | Panotopoulos | G02B 6/29367 385/24 |
| 8,303,195 B2* | 11/2012 | Adachi | G02B 6/4204 385/73 |
| 8,340,522 B2* | 12/2012 | Yu | G02B 6/2706 398/41 |
| 8,540,437 B2* | 9/2013 | Lee | G02B 6/4215 385/31 |
| 8,787,714 B2* | 7/2014 | Morioka | G02B 6/4214 385/15 |
| 9,110,257 B2* | 8/2015 | Morioka | G02B 6/4204 |
| 9,479,258 B1* | 10/2016 | Wolff | H04B 10/40 |
| 9,798,087 B1* | 10/2017 | Mathai | G02B 6/29367 |
| 2004/0042736 A1* | 3/2004 | Capewell | G02B 6/29367 385/89 |
| 2006/0078252 A1* | 4/2006 | Panotopoulos | G02B 6/29367 385/24 |
| 2007/0223552 A1 | 9/2007 | Muendel et al. | |

OTHER PUBLICATIONS

Hallam et al., "Mode Control in Multimode Optical Fibre and its Applications", [online], Nov. 2007, Aston University, Retrieved from the Internet <http://www.halcyon-optical.co.uk/Hallam%20PhD%20thesis.pdf> [retrieved on Aug. 15, 2014], 203 pages.

\* cited by examiner

OPTICAL MODE MATCHING

BACKGROUND

Wavelength division multiplexing (WDM) is useful for increasing communication bandwidth by sending multiple data channels down a single fiber. For example, a 100 gigabit per second (Gbps) link can be constructed by using four channels operating at 25 Gbps per channel, with each channel operating at a different wavelength. A multiplexer is used to join the signals together before transmitting them down the waveguide, and a demultiplexer is subsequently used to separate the signals.

BRIEF DESCRIPTION OF THE DRAWINGS

The accompanying drawings illustrate various examples of the principles described below. The examples and drawings are illustrative rather than limiting.

DETAILED DESCRIPTION

In a WDM optical system, optical signals from two or more sources are joined into a single beam for transmitting down an optical waveguide. Each optical signal has a different peak wavelength. After traveling through the optical waveguide, the optical signals are separated. By multiplexing multiple signals on a single waveguide, the transmission capacity of the waveguide is increased.

A low-cost WDM system is presented below. The system includes different wavelength optical sources, each with a lens designed to mode match light beams generated by an optical source to an optical slab by imaging the generated light beam to a beam waist at a first surface of the optical slab. The optical slab has two opposing surfaces. Wavelength-selective filters are coupled to the first surface, and reflective focusers are coupled to the opposing surface. Signals for the different channels emitted by the optical sources enter the optical slab through the first surface and are redirected within the optical slab alternately between the reflective focusers and the wavelength-selective filters. The reflective focusers each re-image the beam waist of the light beams at a different wavelength-selective filter until a multi-wavelength light beam exits the optical slab, where the multi-wavelength light beam includes at least some light from each optical source. The multi-wavelength light beam can be mode matched to a transmission medium as well. A similar system can be used to demultiplex a multi-wavelength light beam.

Figure 1A:
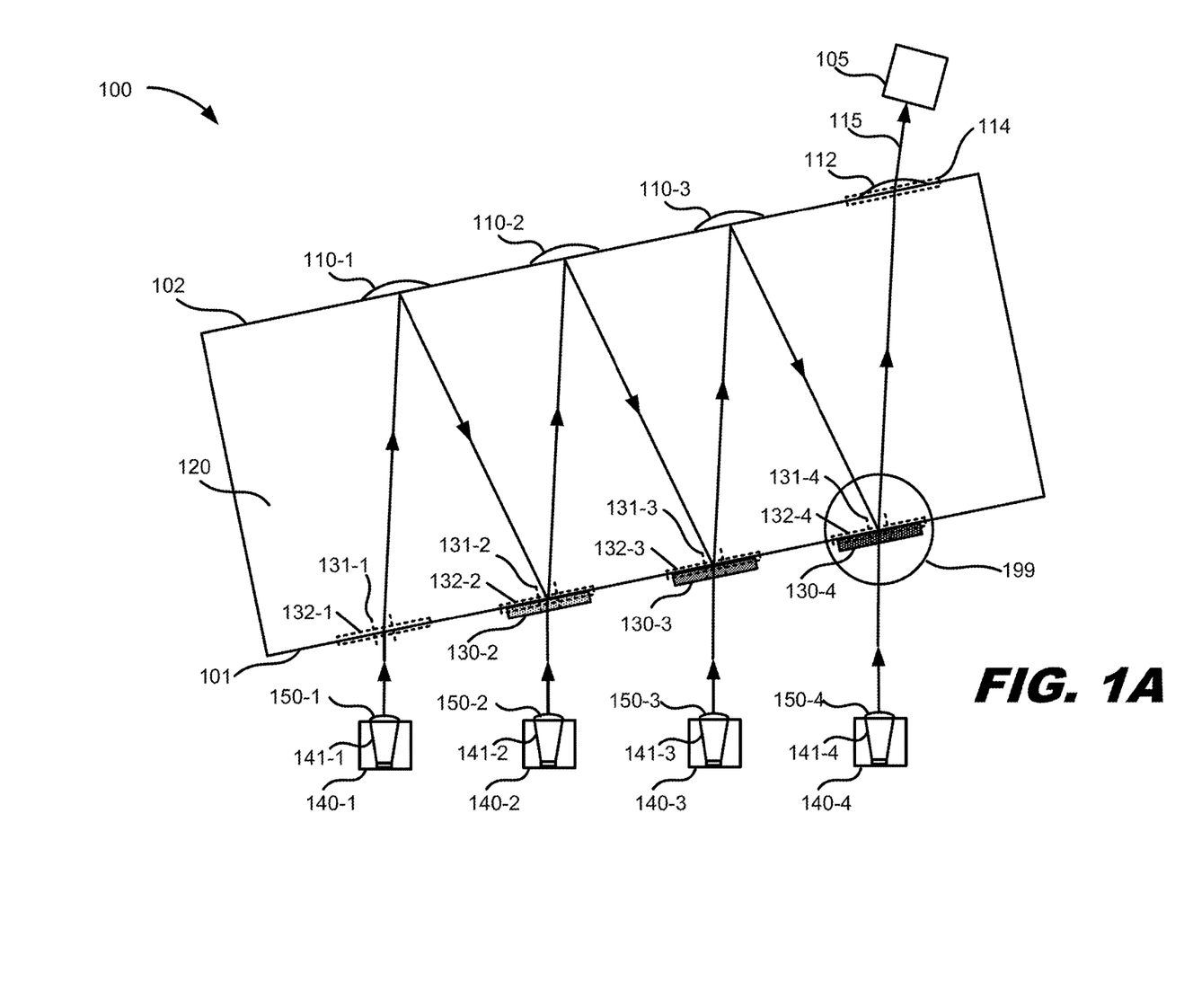
FIG. 1A depicts a block diagram of an example multiplexer system that mode matches light beams from optical sources to an optical body.

FIG. 1A depicts a block diagram of an example multiplexer system 100 that mode matches light beams emitted from optical sources 140 to an optical body 120. In the example of FIG. 1A, four optical sources 140 are shown, but any number of optical sources, greater than one, can be used. The optical sources 140 can be any type of light source that emits a light beam 141 in a band of wavelengths, such as a vertical-cavity surface-emitting laser (VCSEL), a distributed feedback laser, and a fiber laser.

The optical body 120 is optically transmissive at the operating wavelengths and has two opposing surfaces, a first surface 101, and a second surface 102. The distance between the first surface 101 and the second surface 102 is uniform along the length of the optical body 120, for example, as with a slab or block-shaped body. On the first surface 101 are input regions 132, also referred to as input areas, where light beams 141 emitted by the optical sources 140 impinge on the optical body 120. The input regions 132 are distinct from each other. On the second surface 102 is an output region 114, also referred to as an output area, that outputs a multi-wavelength exit light beam 115, where the exit light beam 115 includes at least some light from each of the optical sources 140.

The optical sources 140 are positioned so that each emitted light beam 141 is received at the optical body 120 at a different input region 132 on the first surface 101 of the optical body 120. Each optical source 140 has a corresponding lens 150 to image the emitted light beam 141 to a beam waist 131 having the same beam waist dimensions at an input region 132 at the first surface 101 of the optical body 120. Ideally, each beam waist 131 is imaged exactly at the first surface 101 with the same beam waist dimensions. However, because there are variations in the individual manufactured components of the system 100 (up to approximately 20%), and imaging is wavelength-dependent, it is to be understood that each lens 150 may approximately or substantially image the beam waist 131 at or near the input region 132 with approximately or substantially similar beam waist dimensions when the term 'beam waist' is used herein.

Figure 2:
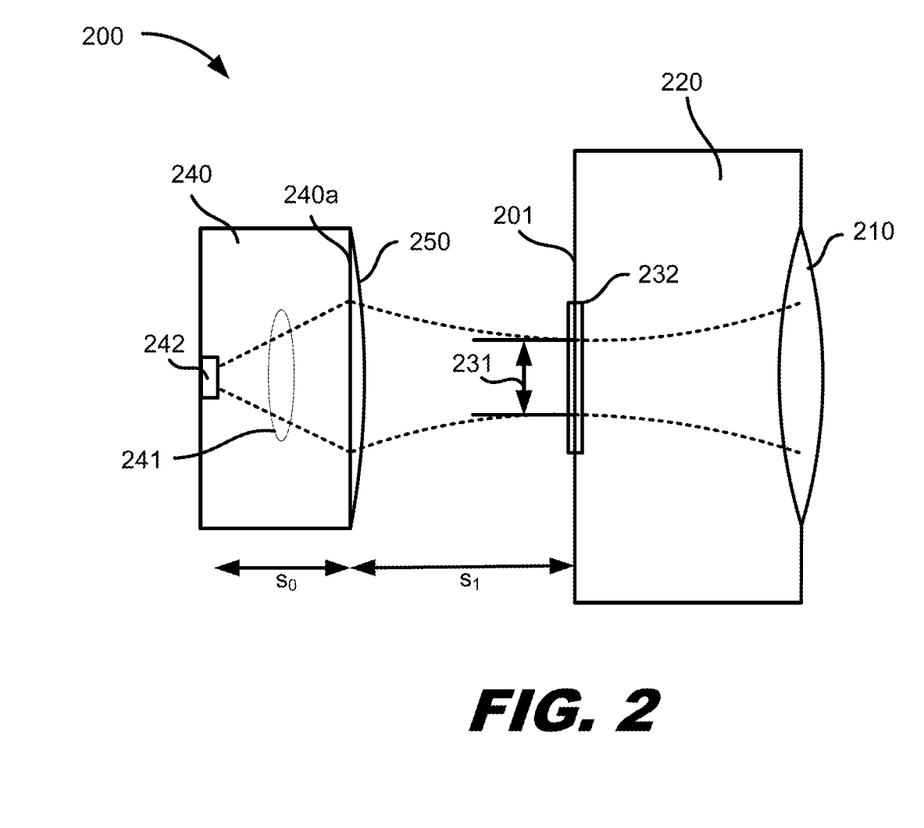
FIG. 2 depicts a diagram of an example vertical-cavity surface-emitting laser (VCSEL) with an integrated lens mode matching an emitted light beam to an optical body.

In some implementations, the optical sources 140 can be vertical-cavity surface-emitting lasers (VCSELs). FIG. 2 depicts a diagram of an example system 200 having a VCSEL 240 as the optical source with an integrated lens 250 that mode matches an emitted light beam 241 to an optical body 220. The VCSEL 240 is a bottom-emitting VCSEL. It is configured to emit the light beam 241 from an active area 242 through the substrate on which the VCSEL 240 was fabricated, and the substrate is transparent at the wavelengths of the emitted light beam 241. The light beam 241 is emitted with a certain beam diameter having a particular divergence angle or numerical aperture and travels through the VCSEL substrate to the exit surface 240a. While the industry term 'bottom-emitting' is used herein, there is no restriction on the orientation of the VCSEL 240.

Coupled to the exit surface 240a of the VCSEL 240 is an integrated lens 250. By integrating the lens 250 on the exit surface 240a of the VCSEL, the magnified output beam from the integrated lens 250 allows for lower-cost passive alignment packaging. Transverse alignment tolerances of the VCSEL 240 to the optical body 120 is increased by approximately an order of magnitude, thus enabling passive optical coupling techniques to be used for assembly of the multiplexing or demultiplexing system. The integrated lens 250 images the emitted light beam 241 with a predetermined magnification to approximately a beam waist 231 at or near the input region 232 on the input surface 201 of the optical body 220.

After focusing down to the beam waist 231, the light beam diverges as it travels through the optical body 220 until it is refocused and imaged down to the beam waist again (not shown in FIG. 2) by reflective focuser 210.

The emitted light beam 241 can be viewed as comprising a set of optical modes, for example, Hermite-Gaussian modes. With Hermite-Gaussian modes, a Rayleigh range $z_r$, for example, for the optical body 220, can be defined as:

$$z_r = \frac{\pi w_0^2}{\lambda}, \quad (1)$$

where $\lambda$ is the wavelength of the light in the transmission medium, and $w_0$ is the radius of the light beam at the beam waist (the minimum spot size) of the beam, and the beam waist is the location where the beam wave front is flat. The Rayleigh range is the distance from the beam waist to where the beam radius has increased to $\sqrt{2}w_0$ and describes the divergence of the Hermite-Gaussian beam. Note that because the Rayleigh range is dependent upon the wavelength of the light, and the optical source 240, such as a VCSEL laser, emits a light beam 241 within a narrow band of wavelengths, the Rayleigh range also varies. The variation of the Rayleigh range is consistent with the beam waist being imaged approximately at the first surface 101 with approximately the beam waist dimensions.

The Rayleigh range $z_{ro}$ for the VCSEL is given approximately by:

$$z_{ro} = \frac{d}{2(NA)}, \quad (2)$$

where d is the diameter of the beam waist in the active region 242, and NA is the numerical aperture of the emitted light beam 241.

The integrated lens 250 mode matches the emitted light beam 241 to the optical body 220 by imaging the emitted light beam 241 at the active region 242 to the beam waist 231 at the input region 232 with a magnification factor M given by:

$$M = \sqrt{\frac{z_{ri}}{z_{ro}}}. \quad (3)$$

That is, the magnification of the light beam is the square root of the ratio of the Rayleigh range within the optical body 220 to the Rayleigh range of the optical source 240.

Additionally, the expression that identifies the location of the beam waist image is given by:

$$\Delta s_i = M^2 \Delta s_o, \quad (4)$$

where $s_i$ is the distance from the integrated lens 250 to the imaged beam waist 231, $s_o$ is the distance from the integrated lens 250 to the emitted light beam 241 originating from the active region 242, $\Delta s_i$ is the differential distance of the location of the beam waist from the focal point of the integrated lens 250, and $\Delta s_o$ is the differential distance of the location of the active region 242 from the focal point of the integrated lens 250. Using expressions (3) and (4) above for determining the magnification and location of the imaged beam waist, this information can then be used to mode match the optical modes of the VCSEL 240 to the optical modes of the optical body 220.

Equivalently, the emitted light beam 241 can be viewed as comprising a set of light rays that propagate from the optical source 240 to the optical body 220. Consider the active region 242 as an extended source emanating light rays. When the light rays reach the integrated lens 250, the integrated lens 250 focuses the rays to a circle of least confusion, equivalent to the beam waist, where the bundle of light rays have a minimum diameter, and the circle of least confusion is located at or near the surface 201 of the optical body 220.

Returning to FIG. 1A, the emitted light beams 141 from the optical sources 140 are imaged to a beam waist 131 within each corresponding input region 132. Further, coupled to each input region 132, except for the input region 132-1 farthest from the output region 114, is a wavelength-selective filter 130. Each wavelength-selective filter 130 reflects light, e.g., at greater than 50% reflectivity, at a first set or group of wavelengths and transmits light, e.g., at greater than 50% transmissivity, at a second set or group of wavelengths. The first set of wavelengths is different from the second set of wavelengths, and each wavelength-selective filter 130 transmits a different second set of wavelengths. For example, the set of wavelengths emitted by optical source 140-2 that is transmitted by wavelength-selective filter 130-2 is different from the set of wavelengths emitted by optical source 140-3 that is transmitted by wavelength-selective filter 130-3 and is also different from the set of wavelengths emitted by optical source 140-4 that is transmitted by wavelength-selective filter 130-4. In general, the peak wavelength of the optical source 140 is matched to the peak transmission wavelength of the wavelength-selective filter 130 to minimize optical power loss in the system 100. Wavelength-selective filters 130 can be made of multiple layers of dielectric material having different refractive indices. A wavelength-selective filter can also be referred to as a wavelength-dependent filter or a wavelength selective element.

Figure 1B:
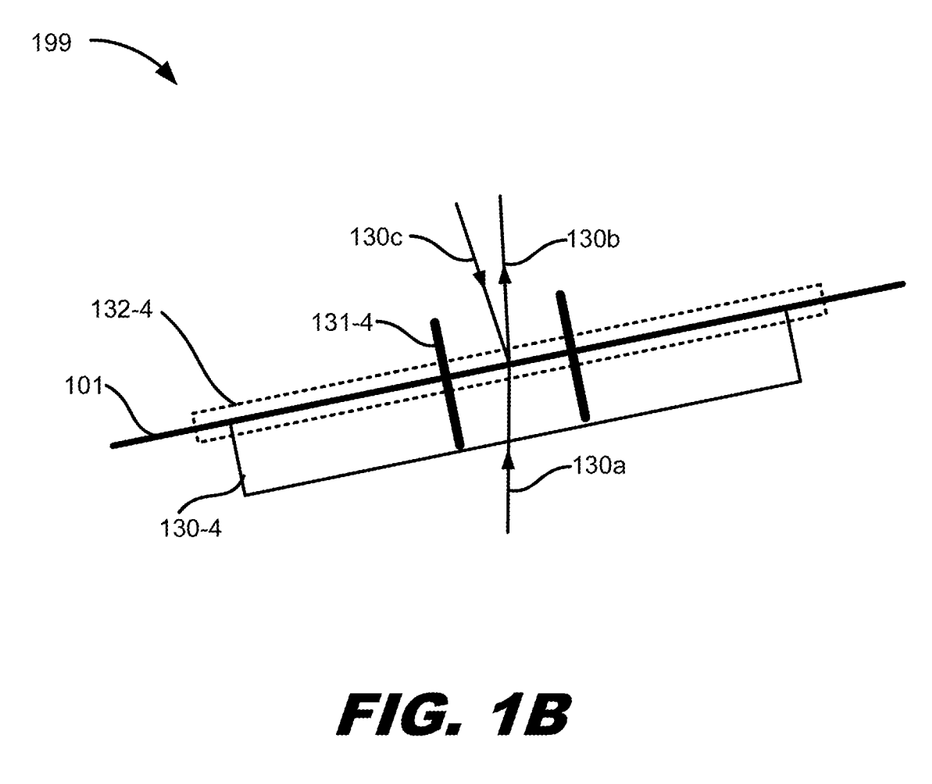
FIG. 1B is a close-up view of one of the input regions of the optical body.

FIG. 1B is a close-up view of the area 199 near one of the example input regions 132-4 of the optical body 120. The input region 132-4 is an area near the first surface 101 of the optical body 120. Coupled to the input region 132-4 is a wavelength-selective filter 130-4. A light beam 130a from an optical source (not shown in FIG. 1B) impinges on the wavelength-selective filter 130-4 coupled to the input region 132-4. Wavelengths in the light beam 130a that are transmitted by the wavelength-selective filter 130-4 are transmitted as part of light beam 130b, while light beam 130c from within optical body 120 impinges on the wavelength-selective filter 130-4 and is reflected as another portion of light beam 130b. Light beams 130a, 130b, 130c are represented by an arrow in FIG. 1B. However, each light beam 130a, 130b, 130c arriving at input region 132-4 has the same or similar beam waist dimensions 131-4, as delimited by the bold lines perpendicular to the surface 101, at or near the surface 101. Similarly, the light beams in FIG. 1A arriving at the other input regions 132 also have the same or similar beam waist dimensions 131 at or near the surface 101.

Referring back to FIG. 1A, light beams transmitted by the wavelength-selective filters 130 and the emitted light beam received at input region 132-1 from optical source 140-1 each travel from surface 101 through the optical body 120 to impinge upon a reflective focuser 110 coupled to the second surface 102 of the optical body 120. Each reflective focuser 110 reflects and focuses an incoming light beam back down to the beam waist 131 at a different one of the wavelength-selective filters 130 at the input regions 132. Examples of a reflective focuser can include a multi-layer stack of dielectric thin films; a Fresnel lens; a curved mirror lens, such as made with a metallic surface, e.g., gold; and a high-contrast grating reflector. A reflective focuser can also be referred to as a focusing mirror, a focusing reflector or a focuser.

Upon hitting the wavelength-selective filters 130, at least some portion of the light beams are reflected back toward the second surface 102 of the optical body 120. Each wavelength-selective filter 130, except for the wavelength-selective filter 130-4 closest to the exit region 114, reflects light to one of the reflective focusers 110, as discussed above. Each wavelength-selective filter 130 also transmits a light beam from an optical source 140. Light within the optical body 120 is redirected alternately between the wavelength-selective filters 130 and the reflective focusers 110 until the light hits the wavelength-selective filter 130-4 closest to the exit region 114.

Wavelength-selective filter 130-4 reflects the light beam from within the optical body 120 to the exit region 114. Wavelength-selective filter 130-4 also transmits a light beam from the optical source 140-4. The reflected and transmitted light beams together make up the exit light beam that is directed toward the exit region 114. The exit beam light beam includes at least some light from each of the optical sources 140, thus, multiplexing the light beams from the optical sources 140.

Coupled to the exit region 114 in FIG. 1A is an output lens 112 configured to image the beam waist 131-4 of the light beam at the input region 132-4 to the beam waist at another location, such as the input to a transmission medium 105. The transmission medium 105 can be, for example, a multimode or single mode optical fiber or planar waveguide. The output lens 112 can also image the beam waist to an intermediate location. In some implementations, the output lens 112 is not present.

Figure 3:
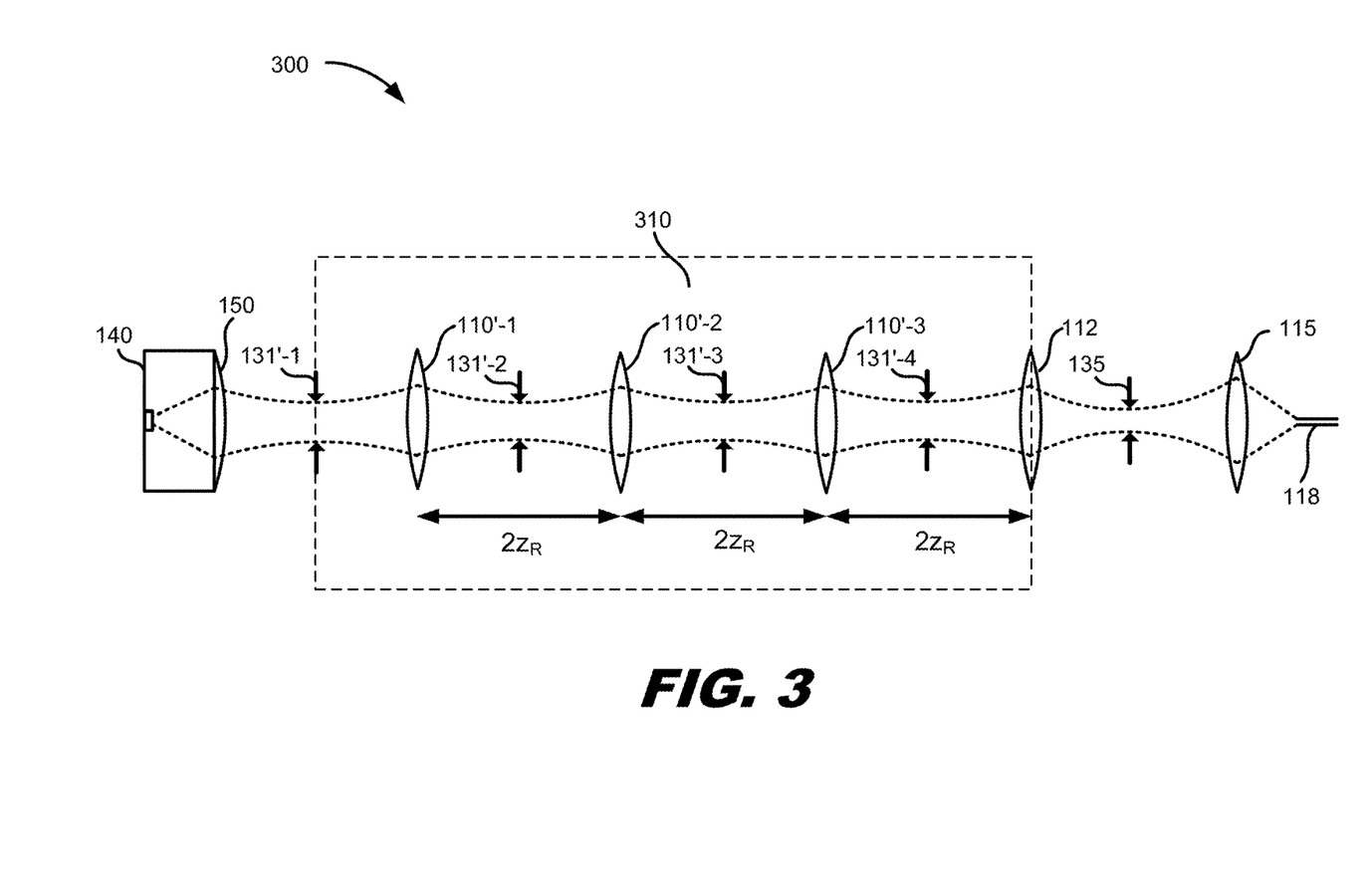
FIG. 3 depicts a diagram of an example envelope of a light beam emitted from a VCSEL propagating through an unfolded optical body and received by a transmission medium.

FIG. 3 depicts a diagram of an example light beam envelope originating from VCSEL 140 and propagating through an optical body 310, where the optical body 310 is the optical body 120 in FIG. 1A shown unfolded so that the path of the light beam is clearly shown. The integrated lens 150 images the light beam from VCSEL 140 to a beam waist 131'-1 at the surface of the optical body 310. The light beam then diverges until it is focused by the reflective focuser 110'-1 down to the beam waist 131'-2. Because there are four sources in the example of FIG. 1A, the light beam diverges two more times, and each time the beam is focused back down by a reflective focuser 110'-2, 110'-3 to the respective beam waist 131'-3, 131'-4. The reflective focusers 110'-1, 110'-2, 110'-3 each perform one-to-one imaging so that the beam waists 131'-1, 131'-2, 131'-3, 131'-4 are all the same dimensions. In some cases, the distance between a reflective focuser 110' and the corresponding imaged beam waist 131' is one Rayleigh range, while the distance between the beam waist 131' and the subsequent reflective focuser 110' is also one Rayleigh range, as indicated in the example of FIG. 3. Because the Rayleigh range is wavelength dependent and the optical sources 140 emit at at least a narrow band of wavelengths, the distances shown in the example of FIG. 3 is approximately the Rayleigh range ($z_R$). These distances in the unfolded body 310 correspond to the thickness of the optical body 120 between the first surface 101 and the second surface 102. However, the thickness of the optical body 120 can be any value.

From beam waist 131'-4, the beam diverges again until, in some implementations, the lens 112 focuses the light beam to the beam waist 135 at an intermediate location prior to being imaged by another lens 115 to a beam waist at the entrance to optical waveguide 118. The beam waist 135 and the beam waist at the entrance to the optical waveguide 118 are not necessarily similar dimensions as the beam waist 131' because the lenses 112, 115 mode match the beam waist 131' to a Rayleigh range of the optical waveguide 118.

Additionally, tolerances from the manufacturing of the system components may result in slight variations in the location and the dimensions of the beam waist 131' despite the design goal of one-to-one imaging. Thus, when the location of the beam waist is specified at the first surface, or the dimension of the beam waist is specified, it is to be understood that the beam waist location and dimension can vary, but the variations do not contribute more than approximately 3 dB of loss to the system between the optical source 140-1 and the exit region 114.

Figure 4:
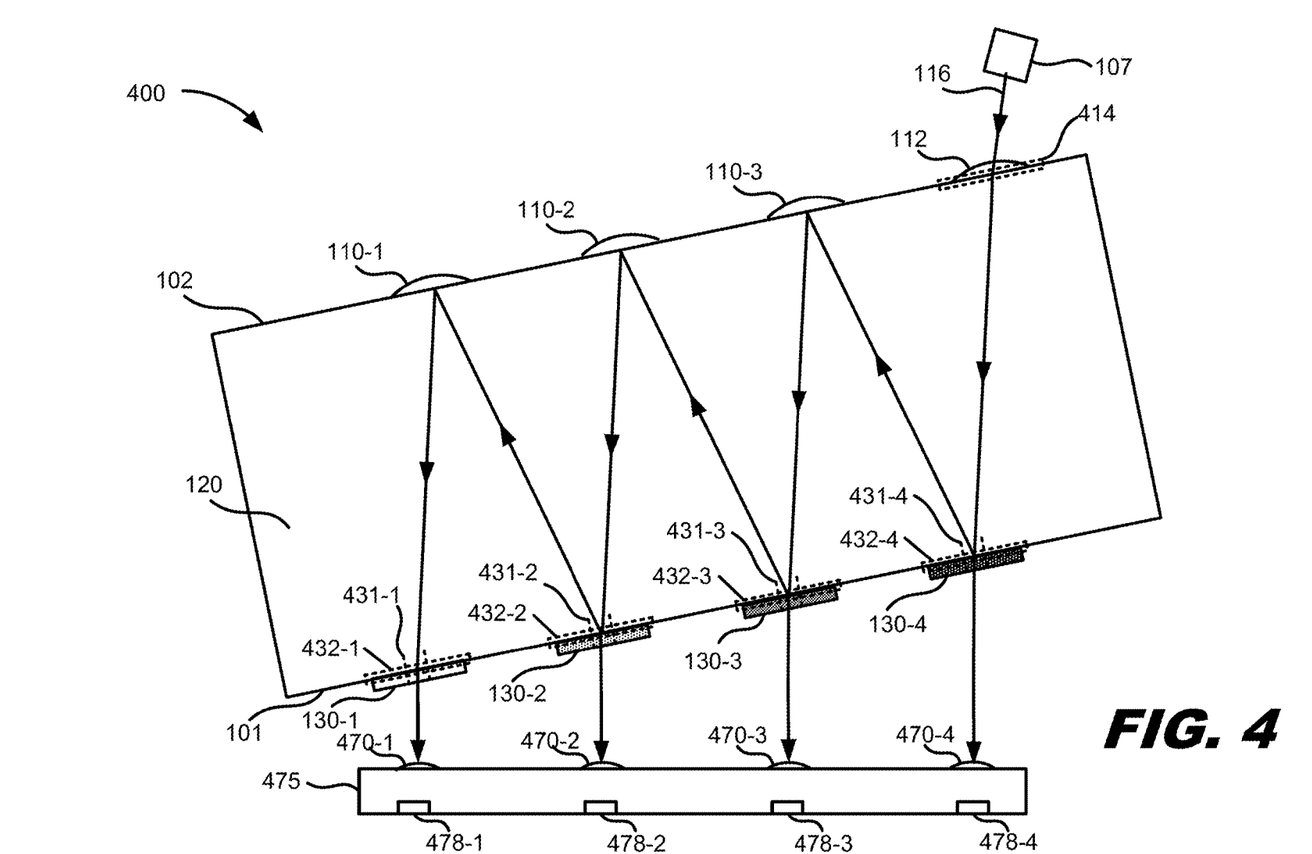
FIG. 4 depicts an example optical system that mode matches a light beam from a transmission medium to an optical body.

In the example of FIG. 1A, the optical body 120 operates as a multiplexer. The optical body 120 can also operate as a demultiplexer, as shown in the example of FIG. 4. The system 400 mode matches the incoming multi-wavelength light beam 116 to the optical body 120. Many of the elements of the multiplexer system 100 in FIG. 1A are also used in the demultiplexer system 400, for example, the reflective focusers 110 and the wavelength selective filters 130. For consistency, the first surface of the optical body 120 refers to the surface to which the wavelength-selective filters are coupled, and the second surface of the optical body 120 refers to the surface to which the reflective focusers 110 are coupled.

The multi-wavelength light beam 116 enters the optical body 120 at input region 414 on the second surface 102 of the optical body 120. The multi-wavelength light beam 116 can, e.g., be an output from an optical waveguide 105, such as a single mode or multimode optical fiber or planar waveguide. Lens 112 is coupled to optical body 120 at input region 414. Lens 112 mode matches optical modes propagating in the optical waveguide 105 to optical modes in the optical body 120 by imaging the multi-wavelength light beam 116 from the optical waveguide 105 to a beam waist 431-4 at output region 432-4. One or more other lenses (not shown) can be used with lens 112 to perform the mode matching. Further, the beam waist 431 can be different in dimension from the beam waist 131 in the example of FIG. 1A.

Coupled to the output region 432-4 is the wavelength-selective filter 130-4. As discussed above, wavelength-selective filter 130 reflects light, e.g., at greater than 50% reflectivity, at a first set of wavelengths and transmits light, e.g., at greater than 50% transmissivity, at a second set of wavelengths, where the first set of wavelengths is different from the second set of wavelengths, and each wavelength-selective filter 130 transmits a different second set of wavelengths. A portion of the multi-wavelength beam 116 is transmitted by the wavelength-selective filter 130-4 to detector 478-4.

The detectors can be any type of sensor capable of sensing the system operating wavelengths, such as a photodiode. In the example of FIG. 4, a PIN substrate 475 is shown having four PIN diodes 478. Coupled to the top surface of the PIN substrate 475 are four integrated detector lenses 470, positioned to focus incoming light onto the corresponding PIN diode. Because the active area of the PIN diodes is smaller than the beam waist 431, the detector lens 470 can focus the light beam spot onto the active area, rather than having to mode match to the active area.

Each detector lens 470 is positioned to receive a light beam transmitted from a corresponding wavelength-selective filter 130. While four wavelength-selective filters 130 and PIN diodes are shown in the example of FIG. 4, the demultiplexer system 400 can have any number of wavelength-selective filters 130 and corresponding PIN diodes greater than one. The wavelengths reflected by wavelength-selective filter 130-4 travel through the optical body 120 until a reflective focuser 110-3 coupled to the second surface 102 is reached. As described above, the reflective focuser performs one-to-one imaging of the beam waist at the output region 432-4 to a different output region. Similar to the multiplexer, light is re-directed within the optical body 120 alternately between the wavelength-selective filters 130 and the reflective focusers 110 until the light beam hits a wavelength-selective filter 130 that allows the light to exit the optical body 120. The light that exits the optical body is then focused by a detector lens 470 onto the active area of a corresponding sensor 478.

In some implementations, the light beams transmitted by the wavelength-selective filters 130 can be received by transmission media, rather than detectors. Imaging lenses can be positioned to mode match the output beams from the optical body 120 to the transmission media by imaging the beam waist 131 to an entrance of the transmission media.

In some cases, the same optical body 120 can be used for both multiplexing and de-multiplexing signals. For example, the multiplexing portion can be adjacent to the demultiplexing portion, or the multiplexing portion can be interleaved with the demultiplexing region.

Figure 5:
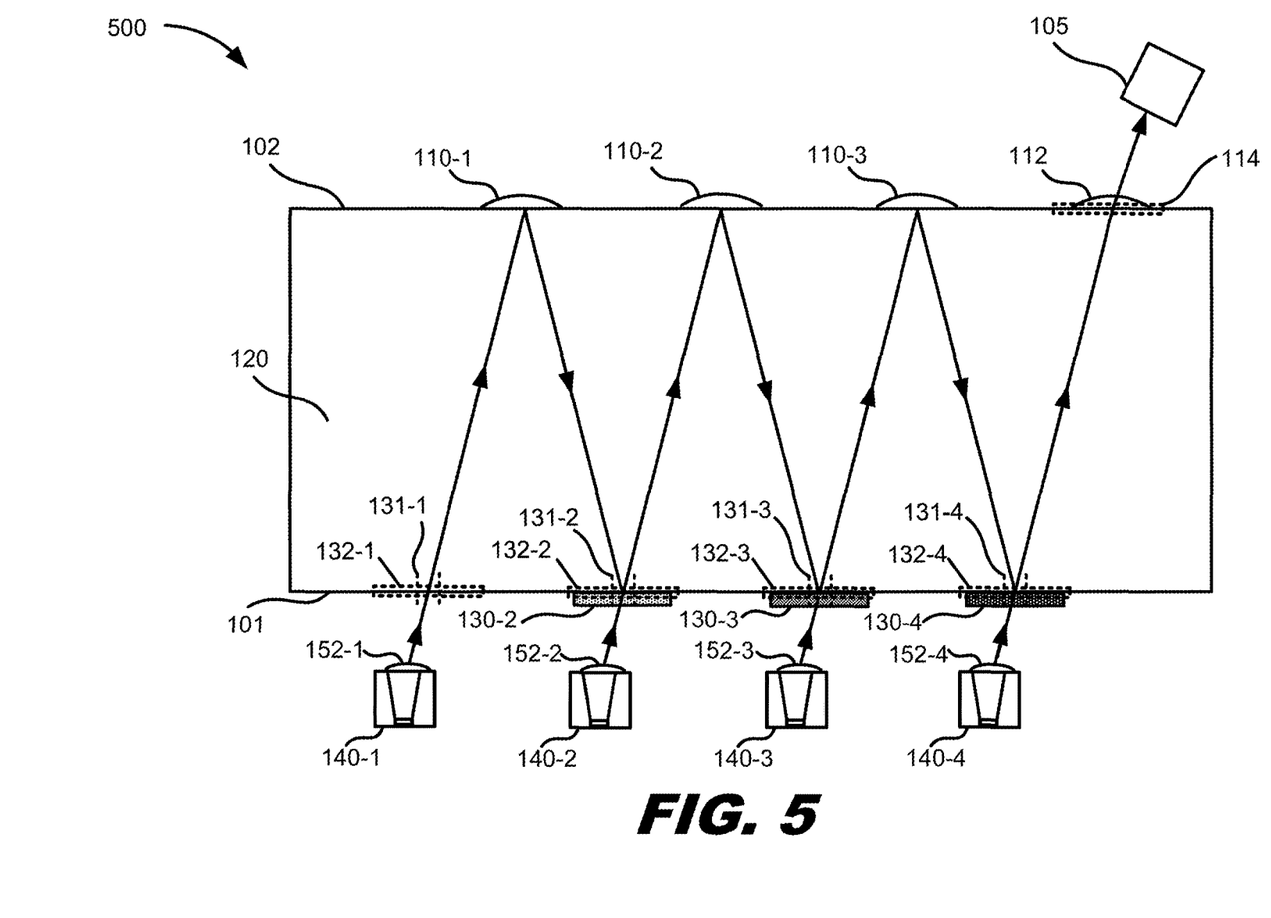
FIG. 5 depicts a block diagram of an example multiplexer system that mode matches light beams from optical sources to an optical body using lenses offset from the optical sources.

FIG. 5 depicts a block diagram of an example multiplexer system 500 that mode matches light beams from optical sources 140 to an optical body 120 using lenses 152 offset from the optical sources 140. When the optical axis of the lens 152 and the propagation direction of the light beam emitted from the optical source 140 are aligned, the optical axis of the light beam focused by the lens 152 will remain the same. However, by offsetting the optical axis of the lens 152 from the emission direction of the emitted light beam, the center of the light beam will not impinge on the center of the lens 152, resulting in a tilting of the propagation direction of the focused beam from the emission direction of the incoming light beam. For the case where the optical source 140 is a bottom-emitting VCSEL, the propagation direction of the emitted light beam is along the growth direction of the VCSEL. If the lens 152 is integrated with a VCSEL substrate and etched so that the optical axis of the lens 152 is offset from the propagation direction of the emitted light beam, the imaged beam will be at an angle relative to the growth direction of the VCSEL.

By using the beam tilt resulting from the offset lens 152, the optical body 120 can be positioned such that the distance between the first surface 101 and each optical source 140 is uniform. As a result, the alignment of the optical sources 140 with the optical body 120 is easier. In contrast, as shown in the example of FIG. 1A, the first surface 101 of the optical body 120 is tilted relative to the optical sources 140 such that the distance between each source and the first surface is different.

Figure 6:
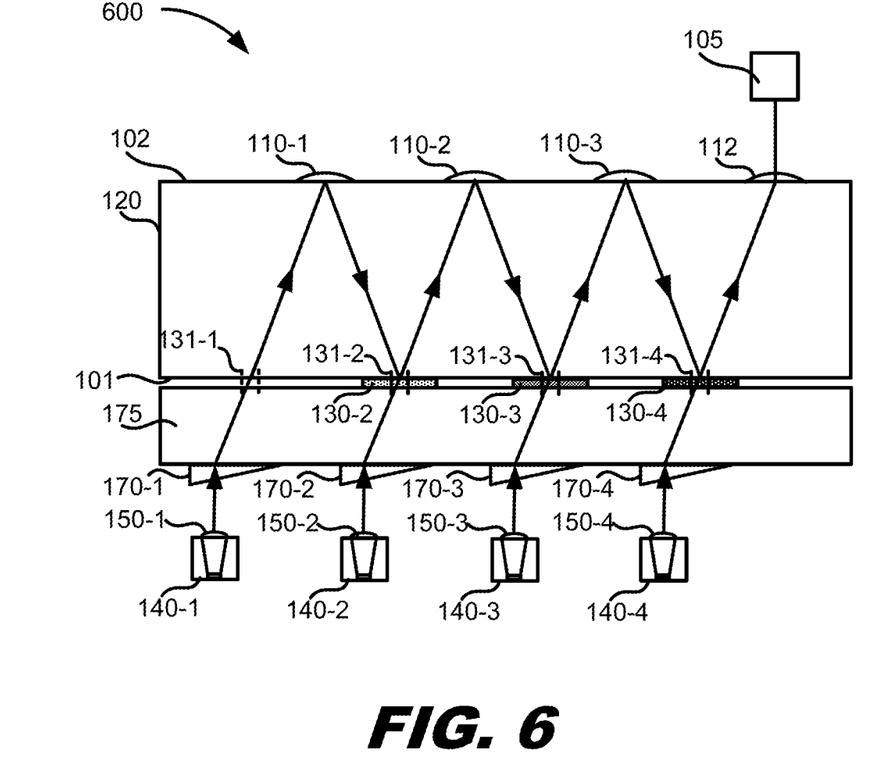
FIG. 6 depicts a block diagram of an example multiplexer system that mode matches light beams from optical sources to an optical body using prism wedges to tilt the beams emitted from the optical sources.

FIG. 6 depicts a block diagram of an example multiplexer system 600 that mode matches light beams from optical sources 140 to an optical body 120 using prism wedges 170 to tilt the beams emitted from the optical sources 140. Similar to the offset lens 152, a prism wedge 170 can be used to change the direction of a light beam. The prism wedge 170 can be made from a material that is transparent at the operating wavelengths, such as glass or plastic.

With the prism wedge 170, the light beam is first focused by the integrated lens 152 and subsequently traverses the prism wedge 170. The angle at which the light beam path is changed depends on the angle that the incoming beam to the prism wedge 170 makes with the surface of the prism wedge 170 and on the ratio between the refractive indices of the material of the prism wedge 170 and that of the environment. In the example of FIG. 6, the prism wedge 170 angle and material have been selected so that the light beam exiting the prism wedge 170 is refracted at an angle from the incoming beam, and the optical body 120 can be positioned to have a uniform distance between its first surface 101 and the prism wedges 170 and optical sources 140. As shown in the example of FIG. 6, the prism wedges are coupled to an optical block 175 that has low loss at the operating wavelengths. The optical block 175 can be coupled to the first surface 101 of the optical body 120, sandwiching the wavelength selective filters 130 in between the optical block 175 and the optical body 120.

What is claimed is:

1. An optical multiplexer comprising:
    a plurality of optical sources, each optical source to generate a source light beam at a different group of wavelengths, and each optical source having a source lens;
    an optically transmissive block configured as a single slab having two opposing sides, wherein the opposing sides comprise a first surface having a plurality of input areas, and each input area receives a different one of the source light beams, and a second surface opposite the first surface having an output area at which a multi-wavelength light beam exits the optically transmissive block;
    a plurality of wavelength-dependent filters (WDFs) coupled to the first surface of the optically transmissive block, wherein each WDF is positioned at a different one of the input areas, and wherein each WDF transmits at least some light at a first group of wavelengths and reflects at least some light at a second group of wavelengths, and each WDF transmits a different first group of wavelengths;
    a plurality of focusing reflectors (FRs) coupled to the second surface of the optically transmissive block, wherein each FR reflects and focuses a received light beam within the optically transmissive block to approximately a beam waist at a different one of the WDFs,
    wherein a first source light beam generated by the plurality of optical sources enters the optically transmissive block at a first input area and is reflected and focused within the optically transmissive block by a first FR,
    wherein the other source light beams generated by the plurality of optical sources impinge on one of the WDFs,
    wherein the FR and WDFs are positioned such that each of the source light beams are directed alternately between the FR and WDFs until exiting the optically transmissive block at the output area as the multi-wavelength light beam,
    wherein the multi-wavelength light beam includes at least some light from each source light beam,
    wherein each source lens mode matches the source light beams generated from the respective optical source to the optically transmissive block by having a source focal length and being located a respective distance from a corresponding input area to image the source light beams to have approximately the same beam waist dimensions as when emitted at its corresponding input area of the optically transmissive block.

2. The optical multiplexer of claim 1, wherein the plurality of optical sources are bottom-emitting vertical-cavity surface-emitting lasers (VCSELs), and each source lens is integrated on a surface of a substrate of the VCSEL.

3. The optical multiplexer of claim 1, wherein the first surface is tilted relative to the plurality of optical sources, such that each distance between each VCSEL and the first surface is different.

4. The optical multiplexer of claim 1, wherein the plurality of source lenses are offset from the corresponding VCSEL such that the source light beams imaged by the source lenses are at an angle relative to a growth direction of the corresponding VCSEL, and each distance between each VCSEL and the first surface is uniform.

5. The optical multiplexer of claim 1, further comprising a plurality of prism wedges, wherein each prism wedge is positioned to refract a different source light beam at an angle, and each distance between each VCSEL and the first surface is uniform.

6. The optical multiplexer of claim 1, further comprising an output lens to image the multi-wavelength light beam to a different size.

7. The optical multiplexer of claim 6, wherein the multi-wavelength light beam is imaged at a transmission medium, and the transmission medium is an optical fiber or a planar waveguide.

* * * * *